United States Patent
Elwarry et al.

(10) Patent No.: US 8,560,255 B2
(45) Date of Patent: Oct. 15, 2013

(54) POWER METERING AND MERGING UNIT CAPABILITIES IN A SINGLE IED

(75) Inventors: Basem Elwarry, Langford (CA); David T. Tuckey, Victoria (CA)

(73) Assignee: Schneider Electric USA, Inc., Palatine, IL (US)

( * ) Notice: Subject to any disclaimer, the term of this patent is extended or adjusted under 35 U.S.C. 154(b) by 443 days.

(21) Appl. No.: 12/334,106

(22) Filed: Dec. 12, 2008

(65) Prior Publication Data
US 2010/0153036 A1 Jun. 17, 2010

(51) Int. Cl.
*G01R 21/00* (2006.01)
*G01R 21/06* (2006.01)

(52) U.S. Cl.
USPC .............. 702/62; 702/57; 702/60; 702/61; 702/64; 702/65; 702/79

(58) Field of Classification Search
USPC .................. 702/60–62, 66, 64–65, 57, 79
See application file for complete search history.

(56) References Cited

U.S. PATENT DOCUMENTS

| | | | |
|---|---|---|---|
| 5,890,096 A * | 3/1999 | Chatrefou et al. | 702/64 |
| 5,995,911 A | 11/1999 | Hart | |
| 6,753,772 B2 | 6/2004 | Winkler | |
| 6,792,337 B2 * | 9/2004 | Blackett et al. | 700/295 |
| 6,845,301 B2 | 1/2005 | Hamamatsu et al. | |
| 6,944,555 B2 * | 9/2005 | Blackett et al. | 702/62 |
| 7,106,162 B2 | 9/2006 | Satto | |
| 7,123,461 B2 * | 10/2006 | Wimmer | 361/93.1 |
| 2003/0101008 A1 | 5/2003 | Hart | |
| 2004/0183522 A1 | 9/2004 | Gunn et al. | |
| 2004/0229578 A1 | 11/2004 | Lightbody et al. | |

(Continued)

FOREIGN PATENT DOCUMENTS

| | | |
|---|---|---|
| WO | WO 2006/094908 A1 | 9/2006 |
| WO | WO 2006/128394 A1 | 12/2006 |
| WO | WO 2008/036303 A2 | 3/2008 |

OTHER PUBLICATIONS

"IEEE Recommended Practice for Network Communication in Electric Power Substations", IEEE Std 1615™-Aug. 8, 2007, hereinafter 'IEEE'. http://ieeexplore.ieee.org/stamp/stamp.jsp?arnumber=04288669.*

(Continued)

*Primary Examiner* — Michael Nghiem
*Assistant Examiner* — Alexander Satanovsky
(74) *Attorney, Agent, or Firm* — Nixon Peabody LLP

(57) ABSTRACT

An intelligent electronic device (IED) integrating a power metering unit (PMU) and a merging unit that combines signals from both analog transformers and digital transformers into a set of merged digital samples. Analog current/voltage signals from analog CTs/PTs are received at the IED's analog inputs and converted to digitized samples. Digital current/voltage samples from digital CTs/PTs are received via point-to-point connections at digital inputs of the IED. A tagging unit applies metadata tags to the digitized and digital samples. The metadata tags include the transformer providing the input signal, sampling rate, primary and/or secondary timestamps, scaling values, calibration values, and/or the location of the IED in the electrical system. The PMU performs metering and/or power quality calculations on the samples, and the calculation results are formatted and transmitted via a master-slave protocol to a requesting master. A grouping unit groups the merged samples into default or custom groupings, which are formatted and transmitted over a network via a publish-subscribe mechanism.

22 Claims, 3 Drawing Sheets

(56) References Cited

U.S. PATENT DOCUMENTS

| | | | |
|---|---|---|---|
| 2006/0052958 A1* | 3/2006 | Hancock et al. | 702/60 |
| 2006/0238932 A1* | 10/2006 | Westbrock et al. | 361/42 |
| 2006/0241880 A1 | 10/2006 | Forth et al. | |
| 2007/0057782 A1 | 3/2007 | Wimmer | |
| 2007/0067119 A1 | 3/2007 | Loewen et al. | |
| 2008/0071482 A1* | 3/2008 | Zweigle et al. | 702/62 |
| 2008/0172192 A1* | 7/2008 | Banhegyesi | 702/61 |
| 2008/0215264 A1 | 9/2008 | Spanier et al. | |
| 2008/0234957 A1* | 9/2008 | Banhegyesi et al. | 702/64 |

OTHER PUBLICATIONS

Cagil R. Ozansoy et al., "The Real-Time Publisher/Subscriber Communication Model for Distributed Substation Systems", IEEE Transactions on Power Delivery, vol. 22, No. 3, Jul. 2007, pp. 1411-1423. http://www.eecs.wsu.edu/~pedrow/classes/ee415/Fall_2007/Team%20and%20Project%20Details/pdf_files_from_instructor/timor.pdf.*

"IEEE Recommended Practice for Network Communication in Electric Power Substations", IEEE Std 1615™- Aug. 8, 2007, hereinafter 'IEEE'. http://ieeexplore.ieee.org/stamp/stamp.jsp?arnumber=04288669.*

Cagil R. Ozansoy et al., "The Real-Time Publisher/Subscriber Communication Model for Distributed Substation Systems", IEEE Transactions on Power Delivery, vol. 22, No. 3, Jul. 2007, pp. 1411-1423. http://www.eecs.wsu.edu/~pedrow/classes/ee415/Fall_2007/Team%20and%20 Projecr%20Details/pdf_files_from_instructor/timor.pdf.*

Written Opinion corresponding to co-pending International Patent Application Serial No. PCT/US2009/066942, European Patent Office; dated Apr. 29, 2010; (6 pages).

International Search Report corresponding to co-pending International Patent Application Serial No. PCT/US2009/066942, European Patent Office; dated Apr. 29, 2010; (4 pages).

"IEC 61850 News;" http//iec61850-news.blogspot.com/search/label/merging%20unit; Aug. 2008 (2 pages).

General Electric; "HardFiber System IEC 61850 Process Bus Solution;" http://www.gedigitalenergy.com/multilin/catalog/hardfiber.htm; 2007/2008; (available as late as and printed in Nov. 2008); (3 pages).

General Electric; "HardFiber System IEC 61850 Process Bus Solution" Video; http://www.gedigitalenergy.com/multilin/products/hardfiber/HardFiberDemo.html; Aug. 2008; (1 page).

Schniewindt; "OPDL—Systems;" http//www.schniewindt.de/index_e.php?sub=elemente_widerstandstechnik_show_e&id=4; (available as late as and printed in Jan. 2009); (1 page).

Schniewindt; "Hybrid Combined Electronic Instrument Transformer;" http://www.schniewindt.de/downloads/he_ctvt.pdf; Aug. 2003; (4 pages).

Netted Automation Information & Communication Systems (NAICS); "Successful demo of IEC 61850-9-1;" http://www.nettedautomation.com/solutions/uca/products/9-1/index.html;Nov. 2002; (4 pages).

International Electrotechnical Commission, Instrument Transformers, Part 8: Electronic Current Transformers, 60044-8 (1st ed. 2002-2007) (130 pages).

* cited by examiner

POWER METERING AND MERGING UNIT CAPABILITIES IN A SINGLE IED

FIELD OF THE INVENTION

Aspects disclosed herein relate generally to intelligent electronic devices, and, more particularly, to an intelligent electronic device with integrated power metering and merging unit capabilities.

BACKGROUND

There exists today controller-based power metering devices, which are a type of intelligent electronic device (IED), that perform metering and power quality calculations. There also exists a device known as a merging unit that combines multiple input (typically digital) signals from various current transformers and potential transformers and outputs a merged set of signals for processing and storage remote from the merging unit. Presently, these power metering and merging functions are carried out in separate devices that have to be cabled together with expensive copper wiring. Samples between these two devices are poorly synchronized, and merging units can provide more signals than actually needed for the particular metering calculation that needs to be performed. For example, when a measurement CT becomes saturated, only data from the protection CT might be useful, but the merging unit will provide signals from both the measurement and protection CTs, which increases network traffic at a time when congestion is disadvantageous, because saturation conditions occur when some type of fault or anomalous event has occurred on the electrical system.

What is needed, therefore, is at least an apparatus that combines power metering and merging unit capabilities into a single IED. The present disclosure is directed to addressing these and other needs.

BRIEF SUMMARY

An intelligent electronic device (IED), comprising: a housing; a plurality of inputs received at the housing and receiving representations of current or voltage signals from corresponding first current transformers or potential transformers; a power metering unit disposed within the housing, the power metering unit calculating a function that includes a representation of any of the current or voltage signals; a merging unit disposed within the housing, the merging unit being configured to combine digital representations of the current or voltage signals into a single set of merged digital samples; a memory disposed within the housing, the memory storing the single set of merged digital samples; and a microcontroller coupled to the memory.

The plurality of inputs can include a plurality of analog inputs, and at least some of the first current transformers or potential transformers can be analog transformers that each outputs an analog representation of an analog current or voltage sensed by respective ones of the at least some transformers. The device can further include a digital conversion unit disposed within the housing, the digital conversion unit converting the analog current or voltage signals from the analog inputs into corresponding digitized current or voltage samples.

The plurality of inputs can also include a plurality of digital inputs, and the representations of current or voltage signals can be digital samples representing the current or voltage signals. At least some of the first current transformers or potential transformers can be digital transformers that each outputs a digital representation of an analog current or voltage sensed by respective ones of the at least some transformers. The first current transformers or potential transformers can include protection current transformers. The first current transformers or potential transformers can include measurement current transformers. The first current transformers or potential transformers can include protection current transformers and measurement current transformers. The device can further include a tagging unit that applies a metadata tag to at least some of the digital representations of the current or voltage signals. The first current or potential transformers can include protection current transformers and measurement current transformers. The merging unit can be configured to combine the digital representations of the current or voltage signals associated with the protection transformers with the digital representations of the current or voltage signals associated with the measurement transformers into the set of merged digital samples.

The metadata tag can further include an indication, for each of the plurality of inputs and, of the physical transformer from which each of the current or voltage signals originated. The metadata tag can further include sampling rates, each of the sampling rates representing a rate at which respective ones of the digital representations of the current or voltage signals were digitally sampled. The metadata tag can further include scaling values corresponding to a ratio of a maximum primary to secondary current associated with respective ones of at least some of the first transformers. The metadata tag can further include calibration values corresponding to a calibration of respective ones of at least some of the first transformers. The memory can store a representation of a physical location of the IED in an electrical system relative to all other IEDs in the electrical system. The metadata tag can further include the representation of the physical location. The device can further include first communications interface for communicating a formatted representation of the single set of merged digital samples over a first communications network to a subscriber device. The formatted representation can be expressed according to a Sampled Measured Values (SMV) format.

The first communications interface can communicate the formatted representation of the single set of merged digital samples via a publish-subscribe messaging protocol. The publish-subscribe messaging protocol can be defined by the International Electrotechnical Commission (IEC) 61850-9 standard. The subscriber device can be a relay, a controller, a remote terminal unit (RTU), or a power meter. The function calculated via the power metering unit can produce metering data. The device can further include a second communications interface for communicating a formatted representation of the metering data over a second communications network to a remote computer system. The remote computer system can be a Supervisory Control and Data Acquisition (SCADA) system. The formatted representation of the metering data can be communicated over the second communications network according to an Ethernet protocol. The function calculated via the power metering unit can produce metering data. The device can further include a second communications interface for communicating a formatted representation of the metering data over the first communications network to a remote computer system.

The microcontroller can be programmed to apply primary timestamps to the digitized current or voltage samples. Each of the primary timestamps can represent a unique time that each of the digitized samples occurred on a primary side of respective ones of the first transformers. The device can further include a tagging unit that applies metadata tags to at least some of the digitized current or voltage samples. Each of the metadata tags can include respective ones of the primary timestamps associated with respective ones of the digitized samples. The plurality of digital inputs can be configured to receive corresponding primary timestamps for each of the digital samples. Each of the primary timestamps can represent a unique time that each of the digital samples occurred on a primary side of respective ones of the first transformers. The microcontroller can be programmed to apply secondary timestamps to at least some of the digital samples. Each of the secondary timestamps can represent a unique time that each of the digital samples was received at respective ones of the digital inputs. The device can further include a tagging unit that applies metadata tags to the digital current or voltage samples. Each of the metadata tags can include respective ones of the primary timestamps and the second timestamps associated with respective ones of the digital samples. The microcontroller can be programmed to apply primary timestamps to the digitized current or voltage samples. Each of the primary timestamps can represent a unique time that each of the digitized samples occurred on a primary side of respective ones of the first transformers. Each of the metadata tags can further include respective ones of the primary timestamps associated with respective ones of the digitized samples.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
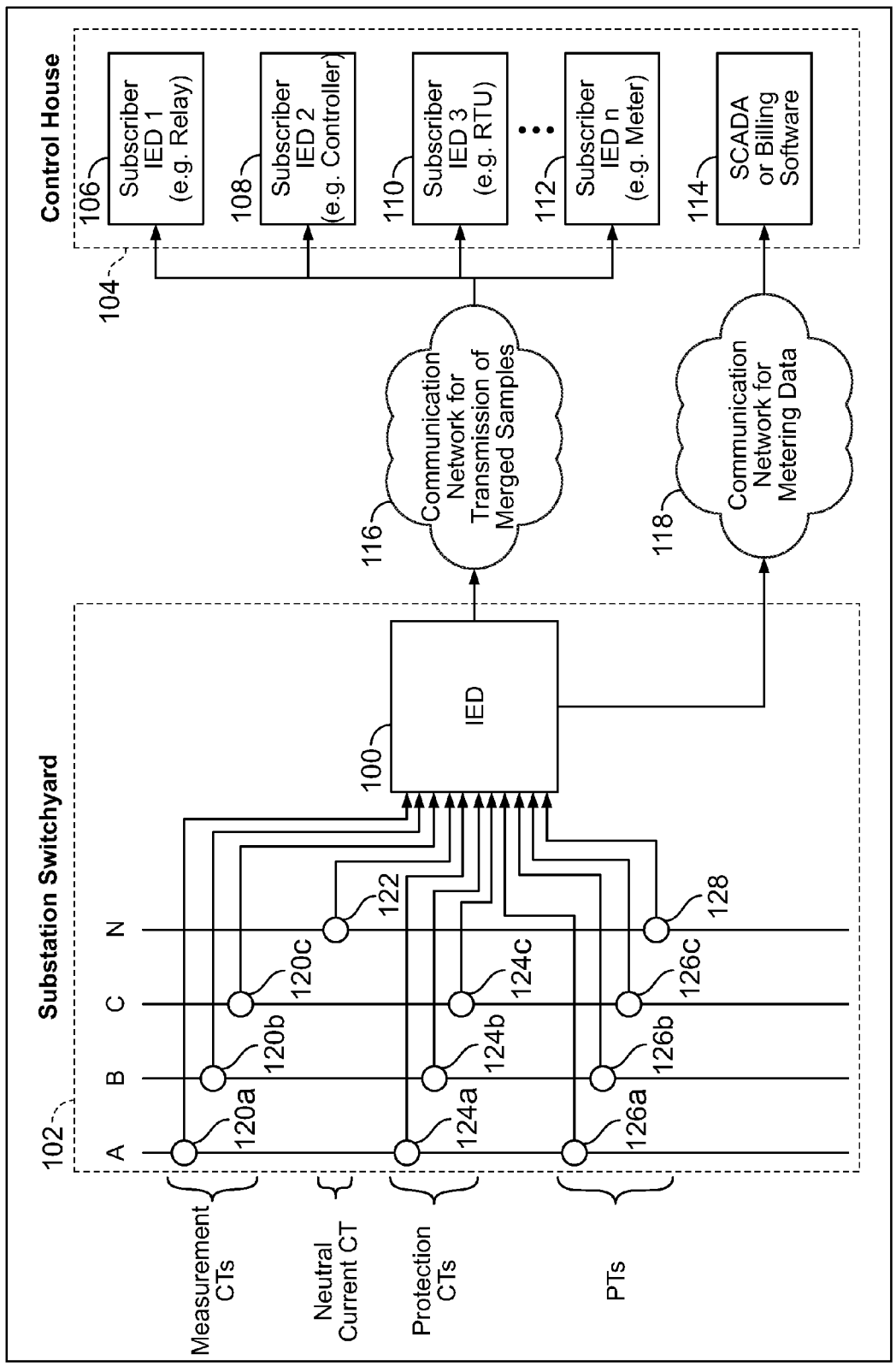
FIG. 1 is a functional block diagram of an electrical system including an intelligent electronic device (IED) according to the disclosed aspects herein.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Turning now to FIG. 1, a novel intelligent electronic device (IED) 100 is shown in a system including a substation switchyard 102 and a control house 104 including multiple IEDs 106, 108, 110, 112 communicatively coupled to the IED 100 via a network 116 and further including a remote computer system 114 that is Supervisory Control and Data Acquisition (SCADA) system running a software application, such as a billing software application. The remote computer system 114 is communicatively coupled to the IED 100 via a network 118, which can be the same network 116 to which the IEDs 106, 108, 110, 112 are coupled or a different one. As used herein, to differentiate between a traditional IED, such as the IEDs 106, 108, 110, 112, and the novel IED 100, the IED according to the present disclosure shall be referred to as the IED 100. The other IEDs 106, 108, 110, 112 can be any conventional microcontroller-based device, including a relay, a controller, a remote terminal unit (RTU), or a circuit monitor or power meter. An IED provides a particular functionality, such as metering, power quality calculations, relay, or protection, to name a few. The circuit monitor or power meter, such as the IED 100, 112, can be based on a POWERLOGIC® Series 3000/4000 Circuit Monitor or a POWERLOGIC® ION7550/7650 Power and Energy Meter available from Schneider Electric.

The IED 100 includes a plurality of inputs that receive analog and/or digital signals from various measurement and/or protection current transformers 120, 122, 124 and/or from various potential transformers 126, 128. Each input can also be referred to herein as a "channel." The transformers can be current transformers (CTs) 120a-c, 122, 124a-c that output an analog or digital signal commensurate with an amount of electrical current flowing in a primary of the CT or potential transformers (PTs) 126a-c, 128 that output an analog or digital signal commensurate with the line-to-line or line-to-neutral voltage in a single or polyphase electrical system. In the example shown, the electrical system supplies three electrical phases (designated conventionally by A, B, and C) and a neutral (designated by N). The terms "measurement" and "protection" current transformers refer to CTs intended for measurement or protection applications. The International Electrotechnical Commission (IEC) distinguishes between these terms, see IEC 60044-8, and this distinction is understood by those skilled in the art to which this disclosure pertains. It should be noted that the outputs of the transformers 120, 122, 124, 126, 128 can be any combination of analog or digital. For example, the measurement CT 120a can output an analog signal representing the electrical current on the secondary winding of the CT 120a, while the measurement CT 120b can output a digital signal representing the electrical current on the secondary winding of the CT 120b. The signal present on the secondary winding is proportional to the corresponding signal present on the primary winding of a transformer.

The IED 100 combines power metering capabilities with the functionality of a merging unit. A merging unit is a unit or circuit that groups input signals together and communicates merged digital samples representing those input signals to other IEDs over a communications network. It is important to emphasize that the IED 100 can accept both analog and digital inputs from transformers or analog only inputs or digital only inputs. Digital current transformers are sometimes known as optical CTs due to the optical output produced by the digital CT representing the analog waveform of the current on the secondary winding and form a direct point-to-point digital connection (i.e., without traversing a network) from the output of the digital CT and the input of the IED 100. It is also important to emphasize that the IED 100 can accept inputs from CTs and PTs (analog or digital or both) used for both measurement as well as protection.

Figure 2:
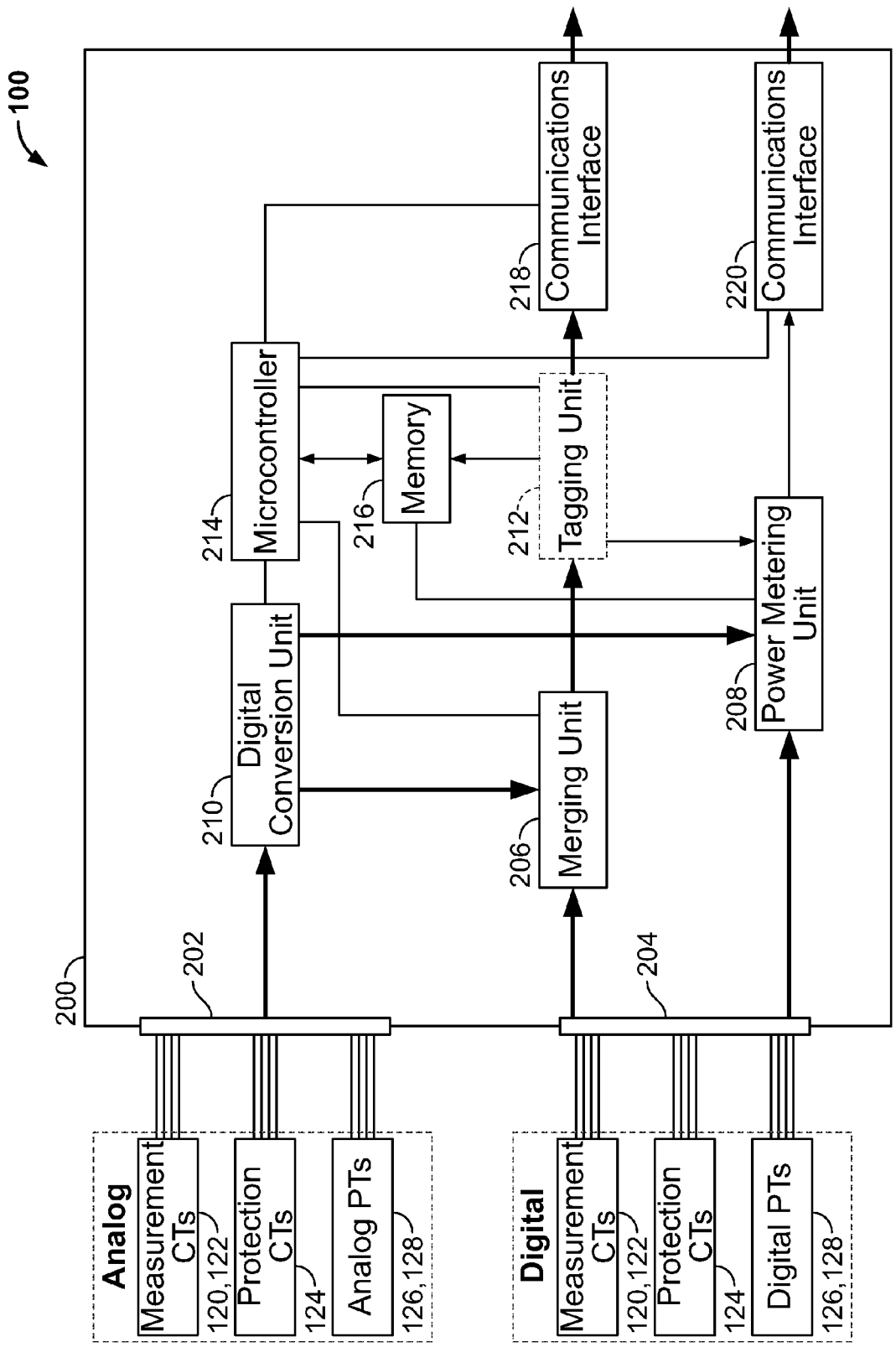
FIG. 2 is a functional block diagram of the IED shown in FIG. 1 that includes a merging unit and a power metering unit.

The term "unit" can refer to an electrical circuit or to a software function. Different units can have overlapping circuits or share common software, such as the tagging unit 212 and the merging unit 206, though their principal functions differ. Although the various units are shown in FIG. 2 as being physically distinct from one another, in fact they need not be. For example, without providing every conceivable example, the digital conversion unit 210 can be incorporated physically into the circuitry of the microcontroller 214, and so can the memory 216. The power metering unit 208 can include the microcontroller 214 or include a separate digital signal processor for carrying out the metering or power quality calculations. In other words, the units are functional constructs as opposed to physically distinct structures. For implementations in which the IED 100 includes digital inputs only and no analog inputs, no digital conversion unit 210 is needed.

Preferably, the IED 100 is located in the substation switchyard to minimize the distance to the CTs and PTs. Having the IED 100 physically near (e.g., a few feet or less than about 10 yards) the input connection points from the CTs and PTs reduces the length of connective cabling needed to connect the outputs of the CTs and PTs to the inputs of the IED 100. Alternately, instead of being in the substation switchyard, the IED 100 can be located in the control house 104 or another location in the substation switchyard distant from the CTs and PTs, at the expense of increased wiring between the CTs and PTs and the IED 100.

For a given monitoring point 120, 122, 124, 126, 128 in the electrical system, there can be one set of PTs 126, 128 and two sets of CTs, one set of protection CTs 124 and one set of measurement CTs 120, 122. Electrical meters and relays have different requirements for current range and accuracy. Protection relays require a large measurement range to cover fault conditions but do not require a high level of accuracy, while meters require a high level of accuracy and have a lower measurement range. The IED 100 accepts any combination of analog and digital inputs, correlating all channels in time, and communicates the entire set of samples to other IEDs 106, 108, 110, 112 on a communications network 116.

FIG. 2 illustrates a functional block diagram of the IED 100. The IED 100 includes a set of analog inputs 202 that receives corresponding analog signals outputted by analog measurement CTs 120, 122, analog protection CTs 124, and analog PTs 126, 128. The IED also includes a set of digital inputs 204 that receives corresponding digital signals outputted by digital measurement CTs 120, 122, digital protection CTs 124, and digital PTs 126, 128. The same reference numbers are used to refer to both analog and digital transformers because any of the transformers shown in FIG. 1 can be either a digital transformer or an analog transformer. A digital transformer outputs a digital representation of the current on the secondary winding of the transformer or of the voltage relative to another line or neutral, in the form of digital current or voltage samples that are sampled at a particular sampling rate. An analog transformer outputs an analog signal representing the current on the secondary winding of the transformer or of the voltage relative to another line or neutral. Although both analog and digital inputs 202, 204 are shown in FIG. 2, it should be understood that in other implementations, the IED 100 includes analog inputs only or digital inputs only.

The IED 100 further includes a merging unit 206, a power metering unit 208, an optional digital conversion unit 210 (present only when the IED 100 includes analog inputs 202), an optional tagging unit 212, a microcontroller 214, a memory 216, a first communications interface 216, and a second communications interface 220. All of these components are housed within a housing or enclosure 200 of the IED 100. The analog inputs 202, the digital inputs 204, the first communications interface 218, and the second communications interface 220 are accessible from outside of the housing 200. Although the optional tagging unit 212 is shown downstream of the merging unit 206, in an alternate implementation, these two blocks can be reversed such that the tagging unit 212 is upstream of the merging unit 206. In this implementation, the digitized samples from the digital conversion unit 210 and the digital samples from the digital inputs 204 are tagged before they are combined in the merging unit 206. This implementation is discussed in more detail below in connection with FIG. 3. It should be noted that the term "digitized samples" are used to distinguish from "digital samples." The "digitized samples" refer to samples that are digitized from the incoming analog signals on the analog inputs 202, while digital samples refer to the digital samples that are received directly at the digital inputs 204. Even though the "digital" samples are already digitized by the CT or PT from which they originated, for convenience, the term "digitized samples" shall be used to refer to the analog signals that are digitized within the IED 100.

Alternately, instead of receiving digital samples or digitized samples from CTs or PTs, the merging unit 206 can be configured to receive digital samples or digitized samples from another IED (not shown) or a communications network (not shown) from another publisher device (with the IED 100 being both a subscriber and a publisher). The IED 100 is coupled to the communications network via a conventional communications interface (wired, wireless (Bluetooth, 802.11), and so forth). It can be appreciated that in addition to the protection current transformers 120, 122, 124 and potential transformers 126, 128, additional external measurement or protection CTs and/or PTs can be coupled with the IED 100 to supplement or validate the measurements from the substation switchyard 102. For example, test or temporary protection and measurement CTs can be utilized in lieu of or in parallel with the protection circuit transformers 120, 122, 124 and potential transformers 126, 128 to validate their settings and output signals.

The digital conversion unit 210 converts the analog current or voltage signals from the analog inputs 202 into corresponding digitized current or voltage samples, based on a sampling rate that can be adjusted as a function of the type of transformer from which the analog signal originated. As mentioned above, analog signals from a measurement CT can be sampled at a higher sampling rate (e.g., 1024 samples per cycle) than analog signals from a protection CT (e.g., 20, 48, 80, or 128 samples per cycle). The digital conversion unit 210 determines the appropriate sampling rate for each of the incoming analog signals from the analog inputs 202, and passes the resulting digitized analog or voltage signals to the merging unit 206 and/or to the power metering unit 208. The user can select which channel(s) to transmit over the communications network 116, 118. For example, because the IED 100 performs metering calculations in the power metering unit 208, the user may not desire to transmit the channels from the measurement transformers. The IED 100 also combines an input signal from a protection CT with an input signal from a measurement CT to create a single stream of digital samples that encompasses the needs of both metering (measurement) and protection. Further details are discussed below.

The power metering unit 208 calculates a function that includes a representation of any of the current or voltage samples carried in the analog or digital inputs 202, 204. Examples of the function calculated by the power metering unit 208 includes a power or energy calculation, root-mean-squared (RMS) calculations for power and energy accumulations, harmonics calculations, power quality calculations that include a Fourier transformation from the time domain to the frequency domain. Any other conventional power metering calculation can be carried out by the power metering unit 208. Examples of a "representation of a current or voltage sample" include a current value, a voltage value, or a value derived from current or voltage such as power, energy, fundamental frequency, or a harmonic frequency, to name a few.

The merging unit 206 combines the digitized current or voltage samples from the digital conversion unit 210 with the digital current or voltage samples from the digital inputs 204 into a single set of merged digital samples. The merged digital samples can be stored in the memory 216.

The merged digital samples are communicated over the communications network 116, 118 in a formatted representation expressed according to a Sampled Measured Values (SMV) format, such as defined by the IEC 61850-9 standard. The merged digital samples are communicated to other IEDs 106, 108, 110, 112 via a publish-subscribe messaging protocol, such as the multicast Ethernet approach defined by IEC 61850.

Figure 3:
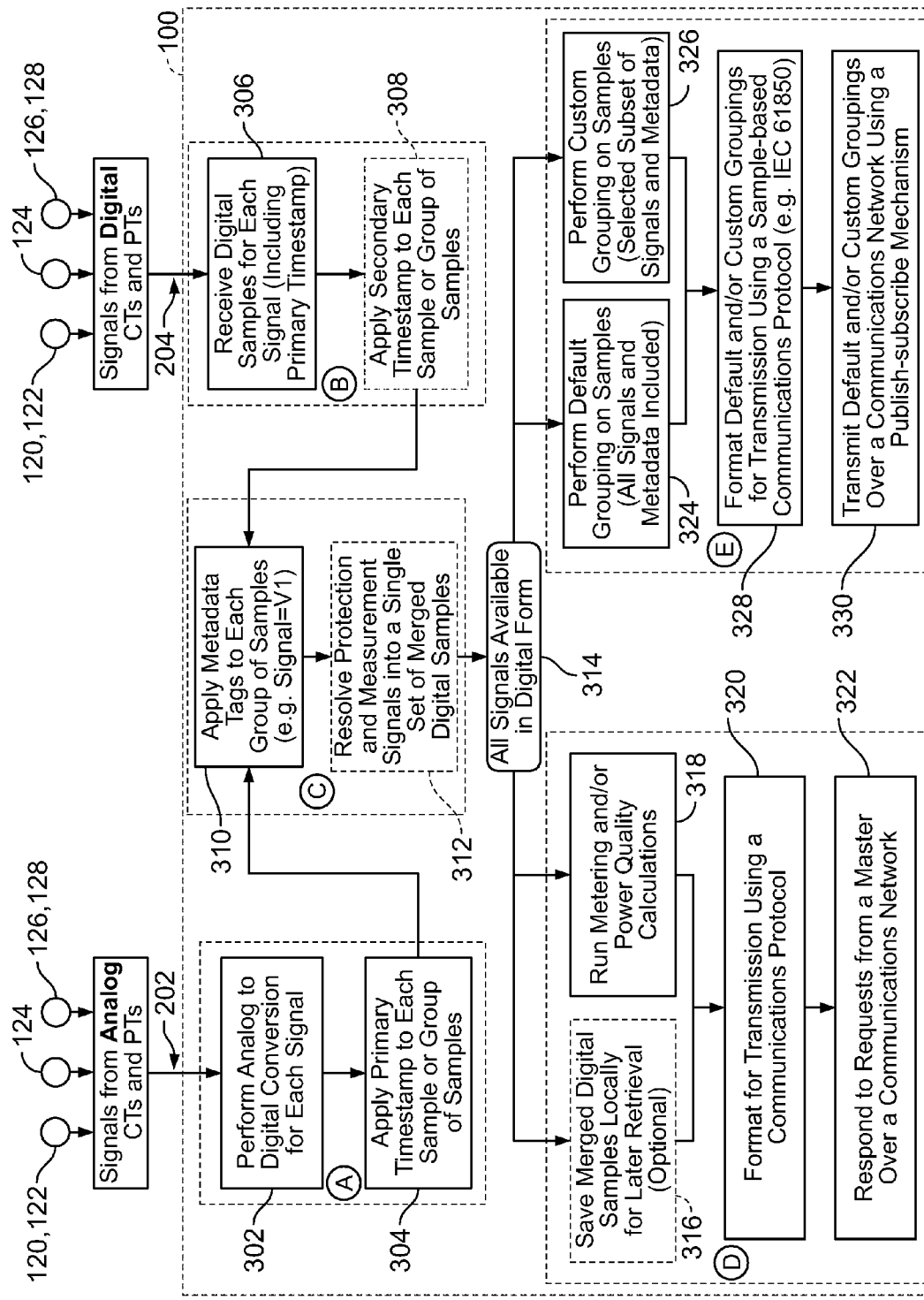
FIG. 3 is a functional block flow diagram of the functional components of the IED shown in FIG. 1.

FIG. 3 is a block diagram of functional components of the IED 100. Signals from the analog CTs and PTs 120, 122, 124, 126, 128 are received at the analog inputs 202 of the IED 100. The digital conversion unit 210 performs analog-to-digital conversion for each of the analog signals to produce corresponding digitized samples (302). The microcontroller 214 applies a primary timestamp to each digitized sample or group of samples (304). Each primary timestamp represents the time that the analog signal represented by the digitized sample occurred on a primary side (i.e., at the primary winding) of the corresponding analog transformer 120, 122, 124, 126, 128. In other words, the primary timestamp is an indication of the time when the current or voltage signal was initially received at the primary winding of a corresponding current or potential transformer. The primary timestamp is distinguished from the secondary timestamp, discussed below. The timestamp can be based upon a global positioning system (GPS) signal that ensure that the onboard clock in the IED 100 is accurate and aligned with a GPS-tracked clock.

On the digital input side of the IED 100, digital samples from the digital CTs and PTs 120, 122, 124, 126, 128 are received at the digital inputs 204 of the IED 100 (306). Each channel that carries a time sequence of digital samples can include a primary timestamp indicating the time when the original analog signal represented by the digital sample was received at the primary winding of a digital CT or PT. The microcontroller 214 applies a secondary timestamp to each digital sample or group of digital samples (308). The secondary timestamp, as distinguished from the primary timestamp, refers to the time that the digital sample was received at a corresponding digital input of the set of digital inputs 204. The secondary timestamp reflects a latency in the delivery of digital samples to the IED, caused by digitization circuitry or algorithms in the digital CT or PT that introduces a delay in the transmission of the digital sample as compared to when its analog counterpart was originally received at the primary winding of the digital CT or PT. The secondary timestamp can be used for diagnostic purposes.

The timestamped digitized samples from the digital conversion unit 210 and the timestamped digital samples from the digital inputs 204 are provided to the tagging unit 212 shown in FIG. 2. As explained above, the tagging unit 212 can be upstream or downstream from the merging unit 206 such that the tagging unit 212 tags the digitized and digital signals prior to providing them to the merging unit 206 for combining or after the signals have been combined by the merging unit 206. The tagging unit 212 applies metadata tags to each group of digitized or digital samples (e.g., Signal=V1, which can correspond to the phase A voltage). The metadata tags can also include the primary and/or the secondary timestamps associated with corresponding digitized samples or digital samples. The metadata tags include information that subsequent blocks (e.g., downstream IEDs 106-112) can process as appropriate. The IED 100 captures identifying information associated with a particular collection of samples for a given input channel (e.g., a full cycle's worth of samples, which, depending upon the sampling rate, can be, for example, 64, 128, or 256 sequential samples). In other words, instead of tagging each sample on a sample-by-sample basis, the IED 100 waits until a collection of samples have accrued and tags the collection of samples. Examples of the metadata fields present in the tags include an indication of the physical transformer from which the samples were derived, such as V1 PT, I1 Measurement CT, I1 Protection CT, and the like. The metadata tag can further include a sampling rate representing a rate at which the digitized samples or the digital samples were digitally sampled. The sampling rate of the digital samples can be manually entered by the user. The metadata tag can further include a scaling value representing the ratio of maximum primary current to maximum secondary current associated with the corresponding CT or PT. The metadata tag can further include one or more calibration values corresponding to a calibration of a corresponding CT or PT. The memory 216 can store a representation of a physical location of the IED 100 in an electrical system relative to all other IEDs 106-112 in the electrical system, and the metadata tag includes the representation of the relative physical location of the IED 100 in the electrical system.

Once the metadata tags are applied to each collection of samples, the merging unit 206 combines the digitized samples and the digital samples from measurement and protection CTs for a given channel (e.g., I1) into a single set of merged digital samples (represented by block 314) that represents the accuracy of the measurement CT (for lower magnitudes) and the range of the protection CT (for higher magnitudes) (312). In other words, the merging unit 206 combines two channels, one containing samples from a protection CT (high range, low accuracy) and another containing samples from a measurement CT (low range, high accuracy), such that the combined set of merged digital samples represents either (a) the samples from the measurement CT if it is not saturated (no fault condition exists), or (b) the samples from the protection CT if the measurement CT is saturated (during a fault condition). The merging unit 206 reduces the number of sample streams that need to be communicated across the network 116, reducing bandwidth and eliminating the need to communicate in separate transmissions digital samples corresponding to the measurement CT and digital samples corresponding to the protection CT. The merged digital samples represented by block 314 can contain different collections of samples at any particular moment in time. For example, only samples from the protection CT can be included in the merged digital samples under fault conditions where the measurement CT would become saturated, and no samples from the measurement CT are included in the merged digital samples. Thus, for the same sample stream, one collection of samples can have one set of metadata (e.g., sampling rate), while another collection of samples can have a different set of metadata. The subscribing IEDs 106-112 are programmed to be capable of accepting a stream of samples with different metadata sets. Instead of selecting only certain channels to be included in the merged digital samples, alternately, multiple channels can be interpolated into a common format, such as having the same sampling rate and having sample magnitudes expressed with the same scale, and the IED 100 selects among the interpolated signals.

The merged digital samples are provided to the power metering unit 208, which optionally saves the merged digital samples in the memory 216 for later retrieval by head-end software systems, such as the remote computer system 114 (316). The storage of the merged digital samples can be triggered by a detected system event or anomaly, instead of recording all merged digital samples on a continuous basis. The power metering unit 208 also performs metering and/or power quality calculations (318) as discussed above. There are two primary categories of calculations: metering calculations and power quality calculations. Examples of metering calculations include calculating RMS power and energy values. Examples of power quality calculations include analyzing variances from a steady-state sinusoidal current signal. The power metering unit 208 is controlled by the microcontroller 214 and calculates on either one channel at a time (for example, when calculating RMS values or frequency harmonics) or on combinations of channels (for example, when calculating power or energy). The results of these calculations are stored in the memory 216.

The merged digital samples or the calculation results from the power metering unit 208 are formatted for communication using a communications protocol, such as the MODBUS® protocol, a distributed network protocol (DNP), Ethernet, or a proprietary communications protocol. The calculation results and the merged digital samples are communicated over the communications network 118 via the second communications interface 220 under control of the microcontroller 214 to the remote computer system 114, preferably using a master-slave polling mechanism. The IED 100 responds to requests from a master (such as the remote computer system 114 or a gateway or another IED) over the communications network 118. The IED 100 can support multiple communications protocols, so the calculations results and the merged digital samples are formatted as appropriate for transmission using one of the various protocols supported by the IED 100. The IED 100 monitors the communication network 118 via the second communications interface 220 for incoming requests from one or more masters, and responds to those requests as appropriate. The communication network 118 can include various different mediums, such as RS-232, RS-485, Ethernet, plain old telephone service (POTS), etc., and as mentioned above can be the same network as the communications network 116 or a different one.

The set of merged digital samples can be grouped based on default or custom groupings and transmitted as a group or one set at a time. This function can be performed by a grouping unit (not shown), which is downstream of the merging unit 206 and upstream of the communications interface 218. By "grouping" in this context, the IED 100 can publish digital samples for all signals received at the inputs 202, 204 or for a default or custom subset of those signals. By default, the IED 100 publishes all signals in a single grouping (324). Thus, the set of merged digital samples includes samples corresponding to all of the inputs 202, 204 into the IED 100. Alternately, the IED 100 can select a customized set of inputs of interest, or the user can select a customized set of inputs of interest, and the IED 100 transmits only the digital or digitized samples corresponding to the selected inputs (or channels) (326). For example, as mentioned above, it may not be necessary to publish digital samples for the measurement CTs because the metering calculations are already performed by the power metering unit 208. Each grouping has one or more associated parameters to identify the particular grouping, and each signal within the grouping is tagged with any or all of the metadata described in block 310. The following identifying information can be used to distinguish among different groupings: a parameter to indicate the name of the grouping, the number of data members in the grouping, or a description field to identify the type of data that is stored in the grouping, such as whether the data represents signals from a CT, a PT, or both. Optionally, additional calculated data can be included with each signal in a grouping. The calculated data represents certain metering calculations based on the samples within the window being transmitted, such as the measured line frequency or RMS calculations for each signal.

The default or custom groupings are formatted for transmission using a sample-based communications protocol, such as one defined by the IEC 61850 standard (328). The IED 100 transmits the default or custom groupings over the communications network 116 via the first communications interface 218 using a publish-subscribe mechanism, such as the multicast mechanism defined in the IEC 61850 standard. Here, messages containing default or custom groupings are sent by the publisher (the IED 100) over the communications network 116 in a broadcast or multicast fashion. The IED 100 (publisher) streams its published messages (groupings of merged digital samples), and does not necessarily have prior knowledge of the subscribers who receive the groupings. The subscribers, such as the IEDs 106-112 monitor and filter these messages so that only those messages it needs are received while others are filtered out. The IEDs 106-112 are examples of subscribers. Other subscribers contemplated by the present disclosure include non-IED devices, such as, for example, a particular computer running a web browser (that accepts an RSS feed, for example, from the IED 100).

Once a default or custom grouping is created in blocks 324 or 326, a particular control block (referred to in the IEC 61850 standard as the MSVCB or multicast sample value control blocks) reference the grouping. This control block can include other metadata to distinguish it from other control blocks such as those used in the IEC 61850-9-2 standard. These metadata fields can include a parameter indicating the name of the control block or the name of the grouping it is referencing or a parameter indicating the sampling rate of the grouping.

Any of the algorithms disclosed herein include machine readable instructions for execution by: (a) a processor, (b) a controller, and/or (c) any other suitable processing device. It will be readily understood that the microcontroller 214 includes such a suitable processing device. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts or functional block diagrams depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The IED 100 realizes numerous advantages, many of which are described or suggested above. These and other advantages include reducing the total cost of the electrical system. Instead of two devices (a power metering unit and a separate merging unit), only one is now required. Commissioning time is dramatically reduced as well, because only one device instead of two needs to be installed and commissioned. The IED 100 provides automatic synchronization between analog and digital output signals from CTs and PTs.

The IED 100 provides short-term or long-term local storage for sample streams for later retrieval from the IED 100 and to ensure delivery of all samples to all subscribing units. The IED 100 dramatically reduces the bandwidth for sample transmission if metering samples do not need to be transmitted (because the metering calculations are performed in the IED 100). Only the results of the calculations need to be transmitted, which use far less bandwidth than the underlying samples. The IED 100 also reduces the bandwidth for transmitting the samples by combining the metering and protection signals into a single set of merged digital samples for transmission. For example, the IED 100 can combine I1 from a metering CT and I1 from a protection CT into a single set of merged digital samples. The IED 100 extends the conventional power meter to accept streams of digital samples (samples which were already digitized by the originating CT/PT) as inputs, use those digital samples in metering calculations, and reformat and merge those samples according to other protocols, such as defined by the IEC 61850 SMV standard. The IED 100 can easily accommodate a transformer that can be used for both measurement and protection applications.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. An intelligent electronic device (IED), comprising:
a housing;
a plurality of inputs received at the housing and receiving representations of current or voltage signals from corresponding first current transformers or potential transformers, the first current transformers or potential transformers including a protection current transformer (CT) monitoring a phase of current or voltage and a measurement CT monitoring the same phase of current or voltage as the protection CT, the measurement CT measuring the phase of current or voltage at rated accuracy below a saturation mode of the measurement CT, the protection CT measuring the phase of current or voltage at rated accuracy above the saturation mode of the measurement CT,
wherein the plurality of inputs includes a plurality of analog inputs, wherein some of the first transformers are analog transformers that each outputs an analog representation of an analog current or voltage signal sensed by respective ones of the analog transformers,
wherein the plurality of inputs include a plurality of digital inputs, wherein others of the first transformers are digital transformers, wherein the representations of current or voltage signals received at the plurality of digital inputs are digital samples representing the current or voltage signals sensed by respective ones of the digital transformers, and
wherein the plurality of digital inputs are configured to receive corresponding primary timestamps for each of the digital samples, each of the primary timestamps representing a unique time that each of the digital samples occurred on a primary side of respective ones of the first transformers;
a digital conversion unit disposed within the housing, the digital conversion unit converting the analog current or voltage signals from the analog inputs into corresponding digital representations of current or voltage signals from the analog transformers;
a power metering unit disposed within the housing, the power metering unit calculating a function that includes a representation of any of the current or voltage signals;
a merging unit disposed within the housing, the merging unit being configured to combine the digital representations of the current or voltage signals sensed by the analog and digital transformers into a single set of merged digital samples having a predetermined format, the single set of merged digital samples including the digital representations of the current or voltage signals sensed by the analog and digital transformers;
a tagging unit disposed within the housing and that applies a metadata tag to at least some of the representations of current or voltage signals from the analog or digital inputs, wherein the metadata tag includes an indication of the physical analog or digital transformer from which the corresponding received current or voltage signal originated;
a memory disposed within the housing, the memory storing the single set of merged digital samples; and
a microcontroller coupled to the memory.

2. The device of claim 1, wherein the merging unit is configured to combine the digital representations of the current or voltage signals associated with the protection transformers with the digital representations of the current or voltage signals associated with the measurement transformers into the set of merged digital samples, wherein the digital representations of the current or voltage signals of the single set of merged digital signals includes either the current or voltage signals associated with the protection transformers or the current or voltage signals associated with the measurement transformers.

3. The device of claim 1, wherein the metadata tag further includes sampling rates, each of the sampling rates representing a rate at which respective ones of the digital representations of the current or voltage signals were digitally sampled.

4. The device of claim 1, wherein the metadata tag further includes scaling values corresponding to a ratio of a maximum primary to secondary current associated with respective ones of at least some of the first transformers.

5. The device of claim 1, wherein the metadata tag further includes calibration values corresponding to a calibration of respective ones of at least some of the first transformers.

6. The device of claim 1, wherein the memory stores a representation of a physical location of the IED in an electrical system relative to all other IEDs in the electrical system, and wherein the metadata tag further includes the representation of the physical location.

7. The device of claim 1, further comprising a first communications interface for communicating a formatted representation of the single set of merged digital samples over a first communications network to a subscriber device.

8. The device of claim 7, wherein the formatted representation is expressed according to a Sampled Measured Values (SMV) format.

9. The device of claim 7, wherein the first communications interface communicates the formatted representation of the single set of merged digital samples via a publish-subscribe messaging protocol.

10. The device of claim 7, wherein the subscriber device is a relay, a controller, a remote terminal unit (RTU), or a power meter.

11. The device of claim 7, wherein the function calculated via the power metering unit produces metering data, the device further comprising a second communications interface for communicating a formatted representation of the metering data over the first communications network to a remote computer system.

12. The device of claim 1, wherein the function calculated via the power metering unit produces metering data, the device further comprising a second communications interface for communicating a formatted representation of the metering data over a second communications network to a remote computer system.

13. The device of claim 12, wherein the remote computer system is a Supervisory Control and Data Acquisition (SCADA) system.

14. The device of claim 12, wherein the formatted representation of the metering data is communicated over the second communications network according to an Ethernet protocol.

15. The device of claim 1, wherein the microcontroller is programmed to apply primary timestamps to the digitized current or voltage samples, each of the primary timestamps representing a unique time that each of the digital representations occurred on a primary side of respective ones of the analog transformers.

16. The device of claim 15, each of the metadata tags including respective ones of the primary timestamps associated with respective ones of the digital representations.

17. The device of claim 1, wherein the plurality of digital inputs are configured to receive corresponding primary timestamps for each of the digital samples, each of the primary timestamps representing a unique time that each of the digital samples occurred on a primary side of respective ones of the first transformers, and wherein the microcontroller is programmed to apply secondary timestamps to at least some of the digital samples, each of the secondary timestamps representing a unique time that each of the digital samples was received at respective ones of the digital inputs.

18. The device of claim 17, each of the metadata tags including respective ones of the primary timestamps and the second timestamps associated with respective ones of the digital samples.

19. The device of claim 18, wherein the microcontroller is programmed to apply primary timestamps to the digitized current or voltage samples, each of the primary timestamps representing a unique time that each of the digitized samples occurred on a primary side of respective ones of the analog transformers, and wherein each of the metadata tags further includes respective ones of the primary timestamps associated with respective ones of the digitized samples.

20. The method of claim 19, wherein the merged digital samples include the corresponding metadata tags.

21. The method of claim 19, further comprising applying primary timestamps to the digital representations of the current or voltage signals from the analog transformers, each of the primary timestamps representing a unique time that each of the digital representations occurred on a primary side of corresponding ones of the analog transformers.

22. A method of combining current or voltage signals received from analog and digital transformers into a single set of merged digital samples, comprising:

receiving, at a plurality of analog inputs at a housing, representations of current or voltage signals from corresponding analog transformers including an analog protection current transformer (CT) monitoring a phase of current or voltage and an analog measurement CT monitoring the same phase of current or voltage as the analog protection CT, the analog measurement CT measuring the phase of current or voltage at rated accuracy below a saturation mode of the analog measurement CT, the analog protection CT measuring the phase of current or voltage at rated accuracy above the saturation mode of the analog measurement CT;

receiving, at a plurality of digital inputs at the housing, (a) digital samples of current or voltage signals from corresponding digital transformers including a digital protection CT monitoring a phase of current or voltage and a digital measurement CT monitoring the same phase of current or voltage as the digital protection CT and (b) corresponding primary timestamps for each of the digital samples representing a unique time that each of the digital samples occurred on a primary side of respective ones of the digital transformers;

associating a metadata tag with at least some of the representations from the analog transformers or with at least some of the digital samples from the digital transformers, the metadata tag including an indication of the physical transformer from which the corresponding received current or voltage signal originated;

converting the analog current or voltage signals from the analog inputs into corresponding digital representations of current or voltage signals from the analog transformers;

combining, in a merging unit disposed within the housing, digital representations of current or voltage signals from the analog transformers and the digital transformers into a single set of merged digital samples having a predetermined format, the single set of merged digital samples including the digital representations of the current or voltage signals sensed by the analog and digital transformers; and communicating a formatted representation of the single set of merged digital samples along with the corresponding metadata tags over a communication network to a subscriber device.

* * * * *